(12) United States Patent
Shang et al.

(10) Patent No.: US 9,064,592 B2
(45) Date of Patent: Jun. 23, 2015

(54) SHIFT REGISTER AND A DISPLAY

(71) Applicant: Boe Technology Group Co., Ltd., Beijing (CN)

(72) Inventors: Guangliang Shang, Beijing (CN); Seung Woo Han, Beijing (CN); Jiayang Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 28 days.

(21) Appl. No.: 13/995,672

(22) PCT Filed: Dec. 17, 2012

(86) PCT No.: PCT/CN2012/086797
§ 371 (c)(1),
(2) Date: Jun. 19, 2013

(87) PCT Pub. No.: WO2013/159543
PCT Pub. Date: Oct. 31, 2013

(65) Prior Publication Data
US 2014/0072093 A1  Mar. 13, 2014

(30) Foreign Application Priority Data
Apr. 24, 2012  (CN) .......................... 2012 1 0123468

(51) Int. Cl.
G11C 19/00 (2006.01)
G11C 19/18 (2006.01)
G11C 19/28 (2006.01)
G09G 3/20 (2006.01)
G09G 3/32 (2006.01)
G09G 3/36 (2006.01)

(52) U.S. Cl.
CPC ...... *G11C 19/184* (2013.01); *G09G 2310/0286* (2013.01); *G11C 19/28* (2013.01); *G09G 3/20* (2013.01); *G09G 3/3266* (2013.01); *G09G 3/3688* (2013.01); *G09G 2310/061* (2013.01); *G09G 2320/0223* (2013.01)

(58) Field of Classification Search
None
See application file for complete search history.

(56) References Cited

U.S. PATENT DOCUMENTS

| 7,317,779 B2 * | 1/2008 | Moon et al. ..................... 377/64 |
| 7,317,780 B2 * | 1/2008 | Lin et al. ......................... 377/67 |
| 7,342,568 B2 * | 3/2008 | Wei et al. ...................... 345/100 |
| 7,573,972 B2 * | 8/2009 | Chen ............................... 377/64 |

(Continued)

FOREIGN PATENT DOCUMENTS

| CN | 1868003 A | 11/2006 |
| CN | 101645308 A | 2/2010 |

(Continued)

OTHER PUBLICATIONS

International Search Report mailed Mar. 28, 2013.

(Continued)

*Primary Examiner* — Tuan T Lam
(74) *Attorney, Agent, or Firm* — Ladas & Parry LLP

(57) ABSTRACT

A shift register is used for solving the problem that the shift register in the prior art can only perform a forward scanning driving but can not perform a bi-directional scanning driving. The shift register includes: a first TFT(T1), a second TFT (T2), a reset unit and a pulling-up unit. The present disclosure further provides a display including the shift register. The shift register and the display can achieve a bi-directional scanning driving.

8 Claims, 18 Drawing Sheets

(56) References Cited

U.S. PATENT DOCUMENTS

| | | | |
|---|---|---|---|
| 8,023,611 B2* | 9/2011 | Lin et al. | 377/64 |
| 8,369,479 B2* | 2/2013 | Lin et al. | 377/64 |
| 8,406,372 B2* | 3/2013 | Hsu et al. | 377/64 |
| 2006/0269038 A1* | 11/2006 | Jang et al. | 377/64 |
| 2007/0274433 A1* | 11/2007 | Tobita | 377/64 |
| 2008/0012818 A1* | 1/2008 | Lee et al. | 345/100 |
| 2008/0101529 A1 | 5/2008 | Tobita | |
| 2008/0219401 A1* | 9/2008 | Tobita | 377/79 |
| 2009/0122951 A1 | 5/2009 | Tobita | |
| 2010/0067646 A1* | 3/2010 | Liu et al. | 377/69 |
| 2010/0220082 A1* | 9/2010 | Lin et al. | 345/205 |
| 2011/0057926 A1 | 3/2011 | Shang | |
| 2011/0058640 A1* | 3/2011 | Shang et al. | 377/64 |
| 2011/0170656 A1 | 7/2011 | Liu et al. | |
| 2011/0286571 A1* | 11/2011 | Lin et al. | 377/64 |
| 2012/0087461 A1* | 4/2012 | Liu et al. | 377/69 |
| 2014/0119490 A1* | 5/2014 | Yang et al. | 377/64 |

FOREIGN PATENT DOCUMENTS

| | | |
|---|---|---|
| CN | 102012591 A | 4/2011 |
| CN | 1020024500 A | 4/2011 |
| CN | 102354477 A | 2/2012 |
| CN | 102708818 A | 10/2012 |
| JP | 2001-273785 A | 10/2001 |

OTHER PUBLICATIONS

First Chinese Office Action dated Jul. 23, 2013; Appln. No. 201210123468.0.

Second Chinese Office Action dated Jan. 27, 2014; Appln. No. 201210123468.0.

Korean Office Action dated May 23, 2014; Appln. No. 10-2013-7015276.

Inernational Preliminary Report on Patentability dated Oct. 28, 2014; PCT/CN2012/086797.

Korea Notice of Preliminary Rejection dated Jan. 28, 2015; Appln. No. 10-2013-7015276.

* cited by examiner

SHIFT REGISTER AND A DISPLAY

FIELD OF THE DISCLOSURE

The present invention relates to the technical field of display technology, and particularly to a shift register and a display.

BACKGROUND

A shift register is used for providing driving signals for gate lines and includes a plurality of shift register units arranged at a plurality of stages. FIG. 1A is a schematic structure diagram of a shift register unit in the prior art, and FIG. 1B is a timing sequence diagram of the shift register unit shown in FIG. 1A. As shown in FIG. 1A, the shift register unit includes 12 thin film transistors (TFTs) and a storage capacitor, and a shift register constituted by the shift register units can only achieve a forward scanning driving instead of a bi-directional scanning driving.

SUMMARY

Embodiments of the present disclosure provide a shift register for solving the problem that the shift register in the prior art can only perform a forward scanning driving but can not perform a bi-directional scanning driving, and further provide a display including the shift register.

According to an aspect, there is provided a shift register including a plurality of shift register units at a plurality of stages, the shift register unit at each stage including:

a first Thin Film Transistor (TFT) for charging or discharging a pulling-up node under the control of a driving input signal and a scanning direction selection signal, wherein the first TFT serves as a start switch of the shift register unit at the stage to charge the pulling-up node during a forward scanning driving and serves as a reset switch of the shift register unit at the stage to discharge the pulling-up node during a reverse scanning driving;

a second TFT for charging or discharging the pulling-up node under the control of a first reset signal and the scanning direction selection signal, wherein the second TFT serves as a reset switch of the shift register unit at the stage to discharge the pulling-up node during a forward scanning driving and serves as a start switch of the shift register unit at the stage to charge the pulling-up node during a reverse scanning driving;

a reset unit for resetting the pulling-up node and an output terminal; and a pulling-up unit for pulling up a potential at the output terminal during an outputting phase.

In an example, a gate of the first TFT is connected to an input terminal, a source of the first TFT is connected to the pulling-up node, a drain of the first TFT is connected to a first scanning direction selection signal input terminal;

a gate of the second TFT is connected to a first reset signal input terminal RESET, a source of the second TFT is connected to the pulling-up node, and a drain of the second TFT is connected to the first scanning direction selection signal input terminal.

In an example, the pulling-up unit may include:

a third TFT having a gate connected to a first terminal of a storage capacitor, a source connected to the output terminal and a drain connected to a first clock signal input terminal;

the storage capacitor having the first terminal connected to the pulling-up node and a second terminal connected to the output terminal.

In one embodiment, the reset unit may include:

a fourth TFT having a gate connected to a second clock signal input terminal, a source connected to a low level and a drain connected to the output terminal;

a fifth TFT having a gate connected to a pulling-down control node, a source connected to a pulling-down node and a drain connected to the second clock signal input terminal;

a sixth TFT having a gate connected to the pulling-up node, a source connected to the low level and a drain connected to the pulling-down node;

a seventh TFT having a gate and a drain connected to the second clock signal input terminal and a source connected to the pulling-down control node;

an eighth TFT having a gate connected to the pulling-up node, a source connected to the low level and a drain connected to the pulling-down control node;

a ninth TFT having a gate connected to the pulling-down node, a source connected to the low level and a drain connected to the pulling-up node; and a tenth TFT having a gate connected to the pulling-down node, a source connected to the low level and a drain connected to the output terminal.

In another embodiment, the shift register unit at each stage may also include a first reset control unit for ensuring that the output terminal is reset by the reset unit.

In an example, the first reset control unit may include:

an eleventh TFT having a gate connected to the first reset signal input terminal, a source connected to the low level and a drain connected to the output terminal; and a twelfth TFT having a gate connected to the input terminal, a source connected to the low level and a drain connected to the output terminal.

In another embodiment, the reset unit may include:

a fifth TFT having a gate connected to the pulling-down control node, a source connected to the pulling-down node and a drain connected to the second clock signal input terminal;

a sixth TFT having a gate connected to the pulling-up node, a source connected to the low level and a drain connected to the pulling-down node;

a seventh TFT having a gate and a drain connected to the second clock signal input terminal and a source connected to the pulling-down control node;

an eighth TFT having a gate connected to the pulling-up node, a source connected to the low level and a drain connected to the pulling-down control node;

a ninth TFT having a gate connected to the pulling-down node, a source connected to the low level and a drain connected to the pulling-up node;

a tenth TFT having a gate connected to the pulling-down node, a source connected to the low level and a drain connected to the output terminal; and a thirteenth TFT having a gate connected to a second reset control unit, a source connected to the low level and a drain connected to the output terminal;

wherein the second reset control unit is used to ensure that the output terminal OUT is reset by the reset unit.

In an example, the second reset control unit may include:

a fourteenth TFT having a gate connected to the first reset signal input terminal, a source connected to the gate of the thirteenth TFT and a drain connected to the second scanning direction selection signal input terminal;

a fifteenth TFT having a gate connected to the input terminal, a source connected to the gate of the thirteenth TFT and a drain connected to the second scanning direction selection signal input terminal; and a sixteenth TFT having a gate connected to the first scanning direction selection signal input terminal, a source connected to the low level and a drain connected to the gate of the thirteenth TFT.

In another embodiment, the second reset control unit may include:

a seventeenth TFT having a gate connected to the first reset signal input terminal, a source connected to the gate of the thirteenth TFT and a drain connected to the second scanning direction selection signal input terminal;

an eighteenth TFT having a gate connected to the input terminal, a source connected to the gate of the thirteenth TFT and a drain connected to the second scanning direction selection signal input terminal;

a nineteenth TFT having a gate connected to a second reset signal input terminal, a source connected to the low level and a drain connected to the gate of the thirteenth TFT; and a twentieth TFT having a gate connected to a third reset signal input terminal, a source connected to the low level and a drain connected to the gate of the thirteenth TFT.

According to another aspect, there is provided a display including any one of the above-described shift registers.

The shift register and display according to the embodiments of the present disclosure can achieve a bi-directional scanning driving.

DETAILED DESCRIPTION

In order to make the technical problem to be solved, the technical solutions and advantages of the embodiments of the present disclosure more clear, descriptions will be made for the embodiments of the present disclosure, taken in conjunction with the accompanying drawings.

Figure 1A:
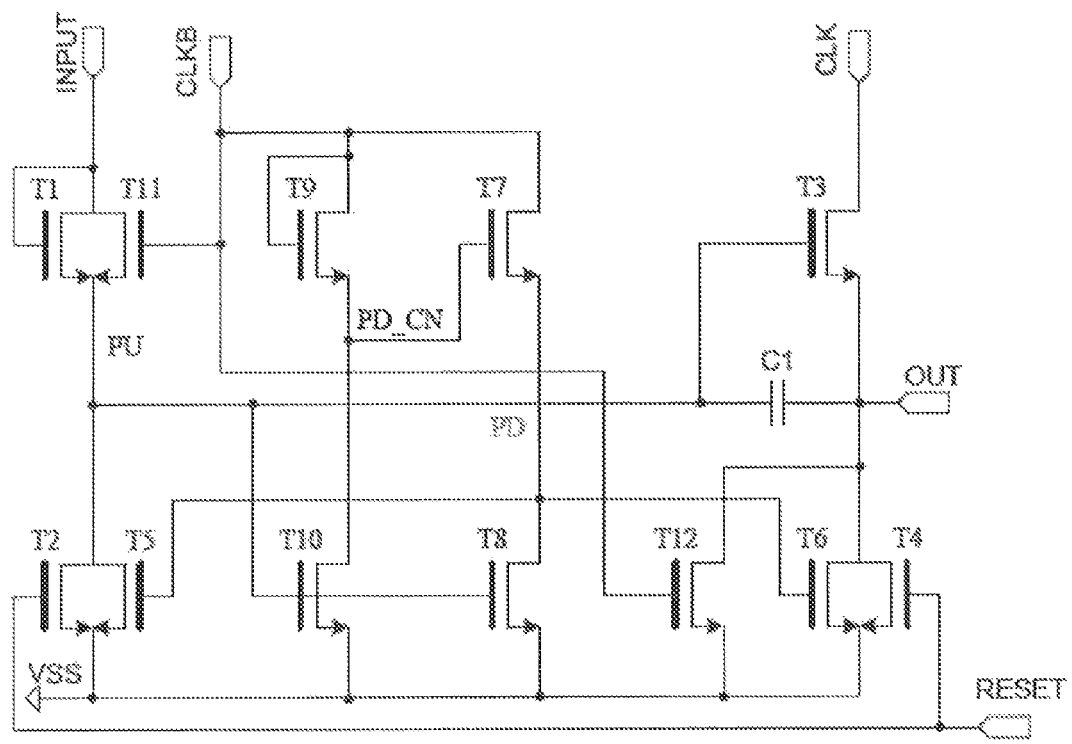
FIG. 1A is a schematic structure diagram of a shift register unit in the prior art.
Figure 1B:
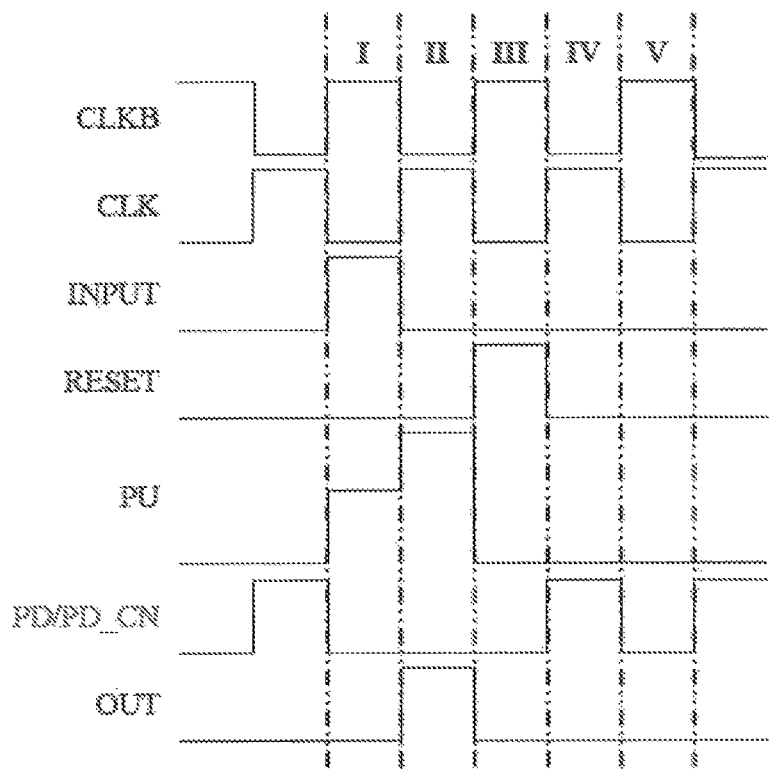
FIG. 1B is a driving timing sequence diagram of the shift register unit shown in FIG. 1A.
Figure 2A:
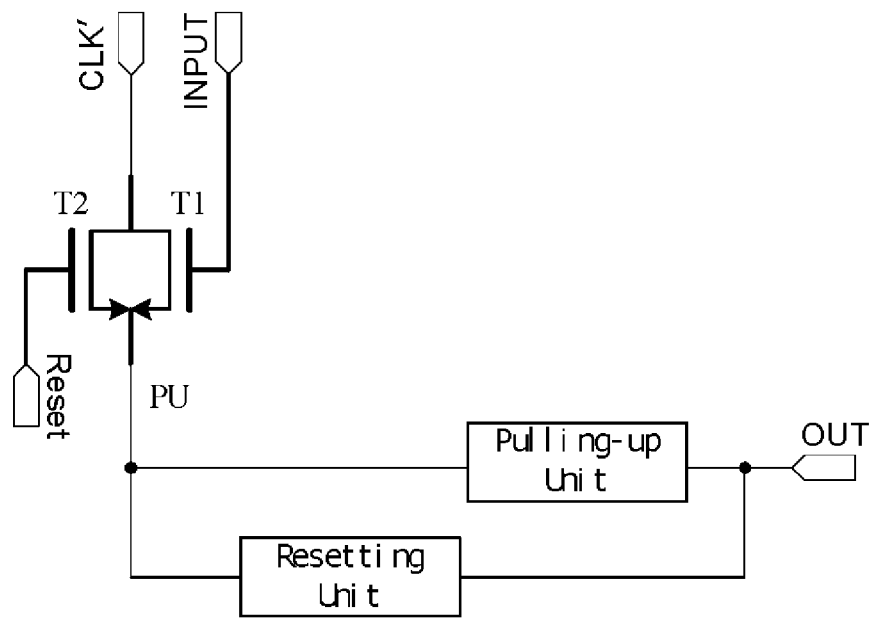
FIG. 2A is a schematic structure diagram of a shift register unit according to an embodiment of the present disclosure.

In Embodiments of the present disclosure, it is provided a shift register including a plurality of shift register units at a plurality of stages as shown in FIG. 2A, the shift register unit at each stage including:

a first Thin Film Transistor (TFT) T1 for charging or discharging a pulling-up node PU under the control of a driving input signal and a scanning direction selection signal, wherein the first TFT T1 serves as a start switch of the shift register unit at the stage to charge the pulling-up node PU during a forward scanning driving and serves as a reset switch of the shift register unit at the stage to discharge the pulling-up node PU during a reverse scanning driving;

a second TFT T2 for charging or discharging the pulling-up node PU under the control of a first reset signal and the scanning direction selection signal, wherein the second TFT T2 serves as a reset switch of the shift register unit at the stage to discharge the pulling-up node PU during a forward scanning driving and serves as a start switch of the shift register unit at the stage to charge the pulling-up node PU during a reverse scanning driving;

a reset unit for resetting the pulling-up node PU and an output terminal OUT;

a pulling-up unit for pulling up a potential at the output terminal OUT during an outputting phase.

In an example, as shown in FIG. 2A, a gate of the first TFT T1 is connected to an input terminal INPUT, a source of the first TFT T1 is connected to the pulling-up node PU, and a drain of the first TFT T1 is connected to a first scanning direction selection signal input terminal CLK';

a gate of the second TFT T2 is connected to a first reset signal input terminal RESET, a source of the second TFT T2 is connected to the pulling-up node PU, and a drain of the second TFT 12 is connected to the first scanning direction selection signal input terminal CLK'.

Figure 2B:
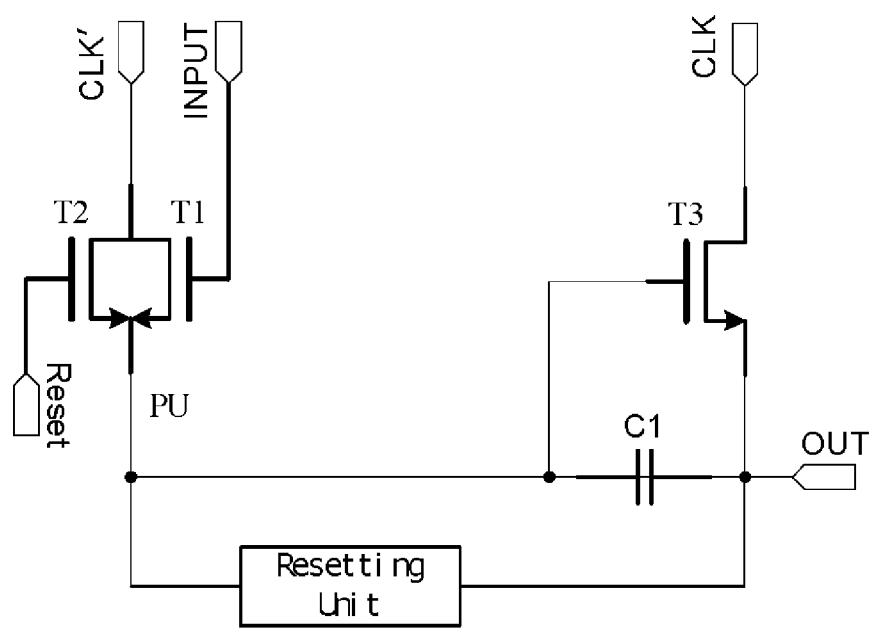
FIG. 2B is a schematic structure diagram of another shift register unit according to an embodiment of the present disclosure.

In an example, as shown in FIG. 2B, the pulling-up unit may include:

a third TFT T3 having a gate connected to a first terminal of a storage capacitor C1, a source connected to the output terminal OUT and a drain connected to a first clock signal input terminal CLK;

a storage capacitor C1 having the first terminal connected to the pulling-up node PU and a second terminal connected to the output terminal OUT.

The shift register provided by the above embodiment of the present disclosure can achieve a bi-directional scanning driving.

Particular implementations of the above shift register will be explained below by a plurality of particular embodiments:

Embodiment 1

Figure 3:
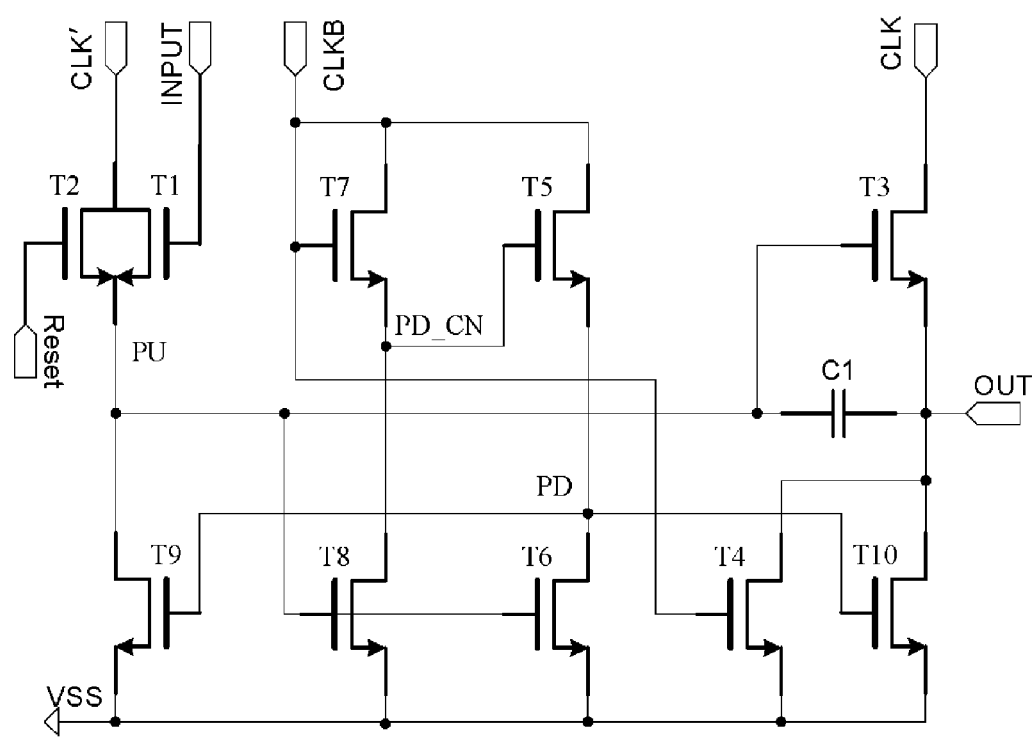
FIG. 3 is a schematic structure diagram of a shift register unit according to a particular embodiment 1 of the present disclosure.

In an example, as shown in FIG. 3, the reset unit described above may include:

a fourth TFT T4 having a gate connected to a second clock signal input terminal CLKB, a source connected to a low level VSS and a drain connected to the output terminal OUT;

a fifth TFT T5 having a gate connected to a pulling-down control node PD_CN, a source connected to a pulling-down node PD and a drain connected to the second clock signal input terminal CLKB;

a sixth TFT T6 having a gate connected to the pulling-up node PU, a source connected to a low level VSS and a drain connected to the pulling-down node PD;

a seventh TFT T7 having a gate and a drain connected to the second clock signal input terminal CLKB and a source connected to the pulling-down control node PD_CN;

an eighth TFT T8 having a gate connected to the pulling-up node PU, a source connected to the low level VSS and a drain connected to the pulling-down control node PD_CN;

a ninth TFT 19 having a gate connected to the pulling-down node PD, a source connected to the low level VSS and a drain connected to the pulling-up node PU; and a tenth TFT T10 having a gate connected to the pulling-down node PD, a source connected to the low level VSS and a drain connected to the output terminal OUT.

Figure 4:
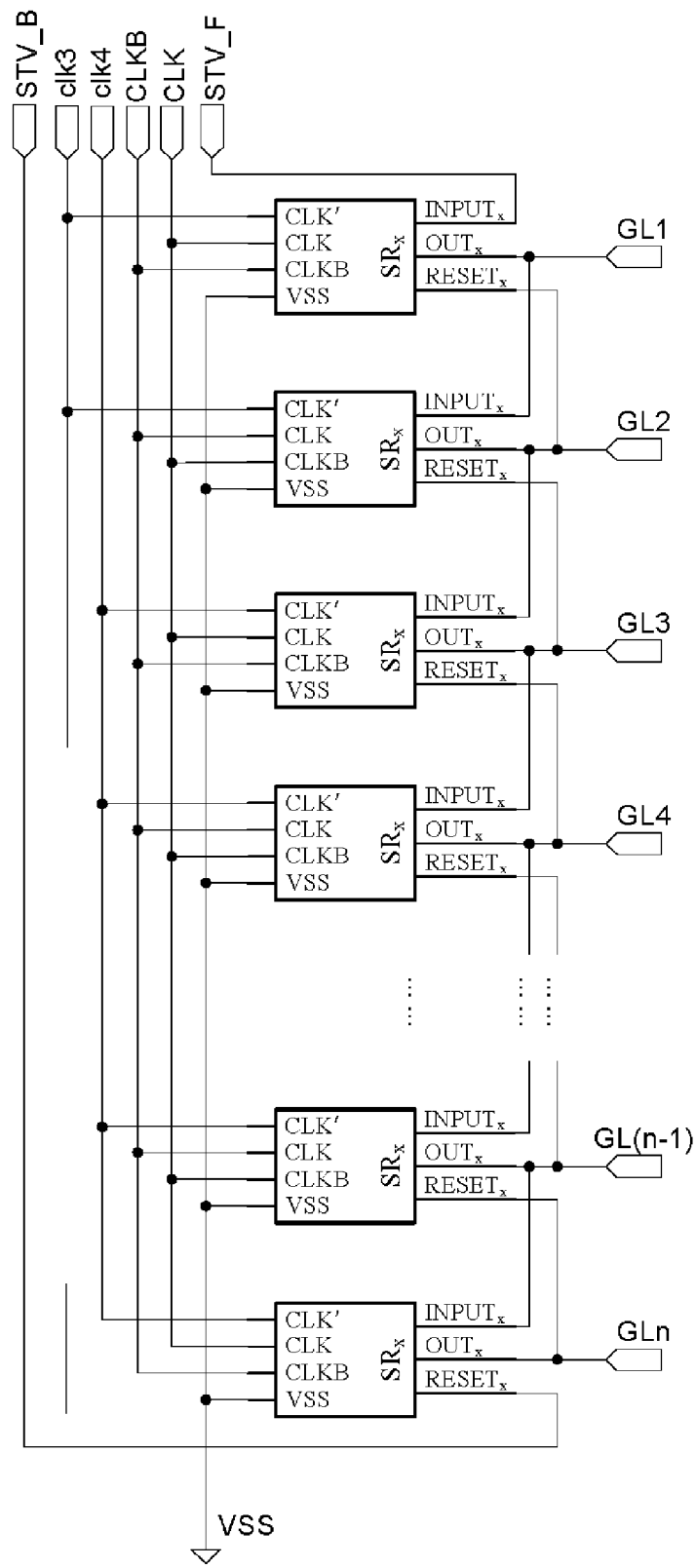
FIG. 4 is a schematic structure diagram of a shift register including the shift register unit shown in FIG. 3.
Figure 5:
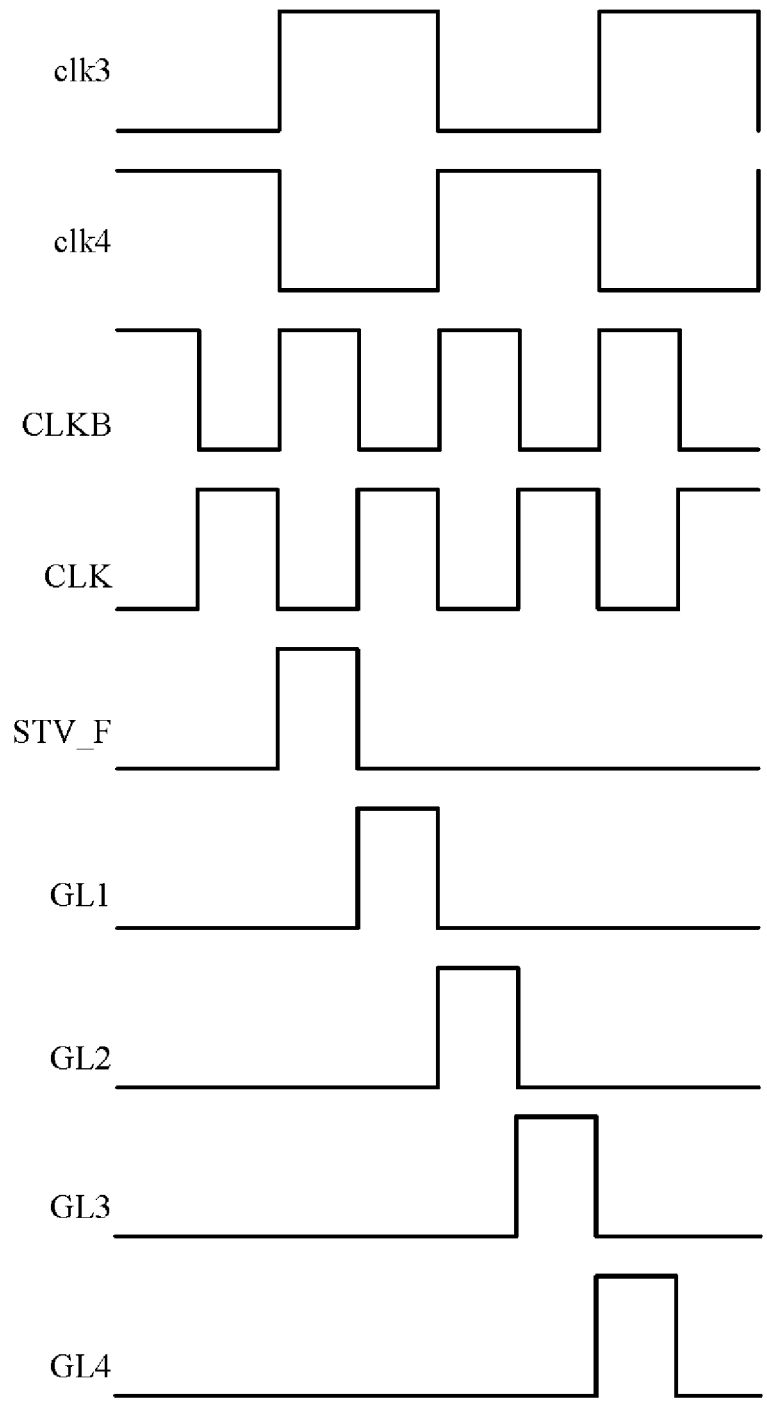
FIG. 5 is a timing sequence diagram for a forward scanning driving of the shift register shown in FIG. 4.
Figure 6:
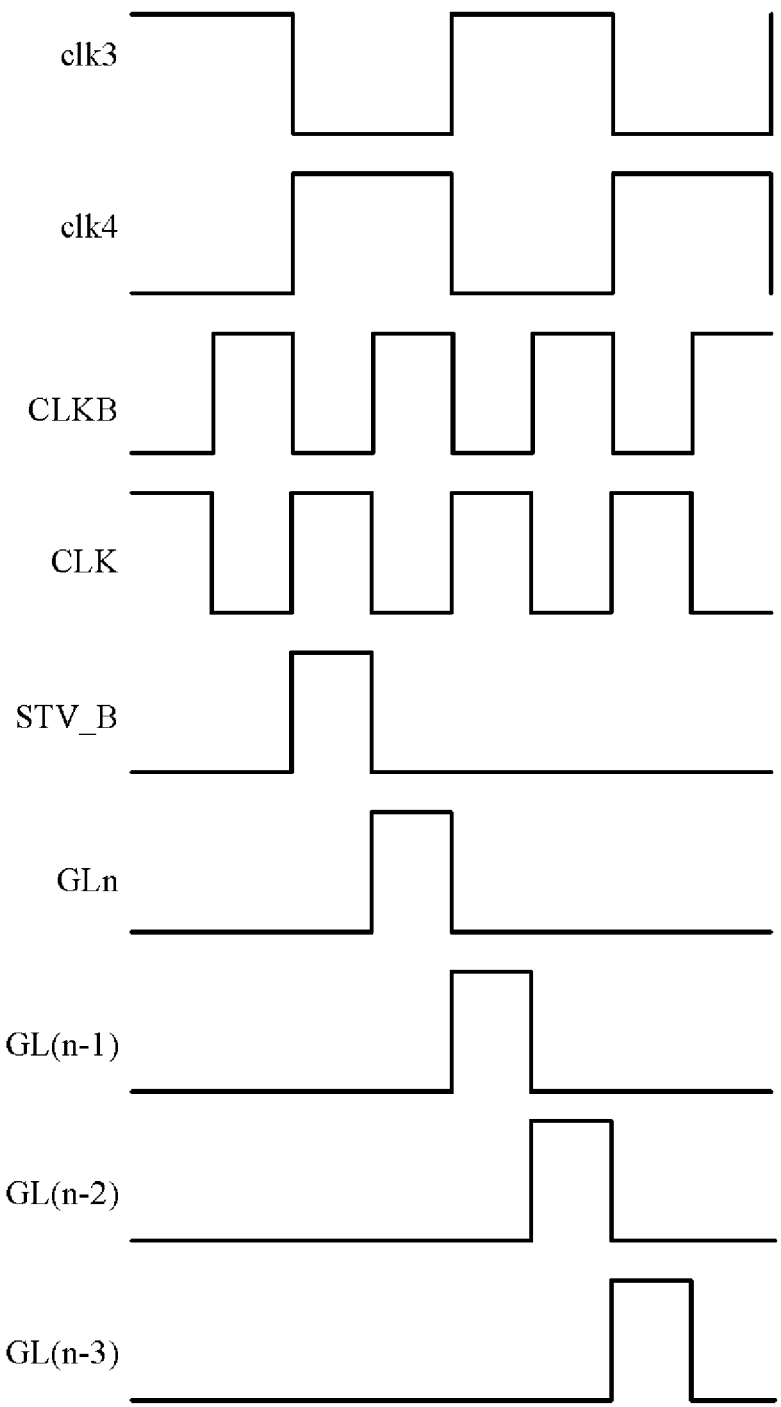
FIG. 6 is a timing sequence diagram for a reverse scanning driving of the shift register shown in FIG. 4.

At this time, a schematic structure of a shift register having the shift register unit shown in FIG. 3 is as shown in FIG. 4, a timing sequence of the forward scanning driving thereof is as shown in FIG. 5 and a timing sequence of the reverse scanning driving thereof is as shown in FIG. 6.

As shown in FIG. 4, main features of the shift register include: the first clock signal input terminal CLK and the second clock signal input terminal CLKB of adjacent shift register units are alternately connected to driving signals CLK and CLKB, respectively; the first scanning direction selection signal input terminals CLK' of four adjacent shift register units are connected to driving signals clk3 and clk4, respectively, wherein two adjacent shift register units are connected to a driving signal and the other two adjacent shift register units are connected to the other driving signal, for example, clk3, clk3, clk4, clk4; or clk4, clk4, clk3, clk3; or clk3, clk4, clk4, clk3; or clk4, clk3, clk3, clk4; and timing sequence for driving should be matched with the particular connection manner; the input terminal INPUT of the shift register unit is connected to the output terminal OUT of the shift register unit at a previous stage, the first reset signal input terminal Reset of the shift register unit is connected to the output terminal of the shift register unit at a next stage, and the input terminal INPUT of the shift register unit at a first stage and the first reset signal input terminal Reset of the shift register unit at a last stage are connected to a frame start signal STV (STV_F and STV_B may be a same signal, and may also be different signals); the output terminals OUT of all the shift register units are connected to corresponding gate lines; and all the VSSs are connected to a low level signal VSS.

Driving signals connected to the first scanning direction selection signal input terminals CLK' of the shift register unit should satisfy three requirements: a first requirement is that the driving signal is at a high level during an input phase (INPUT) of the stage; a second requirement is that the driving signal is at a low level during a reset phase of the stage; and a third requirement is that, in the driving signals connected to the first scanning direction selection signal input terminals CLK' of the shift register unit at the first stage and that at the last stage, one is at a high level and the other is at a low level.

As shown in FIG. 5, during the forward scanning driving, in the shift register unit at the first stage:

During INPUT phase, that is, when signal STV_F becomes a high level, the first TFT T1 is turned on, clk3 connected to the first scanning direction selection signal input terminal CLK' is also at a high level, and then the PU node is charged.

Then, during OUT phase, the first clock signal CLK becomes a high level, an output signal GL1 also becomes a high level; meanwhile GL1 also serves as a gate input signal of the shift register unit at a second stage, and then the first TFT T1 of the shift register unit at the second stage is also turned on. At this time, clk3 connected to the first scanning direction selection signal input terminal CLK' of the shift register unit at the second stage is still at the high level, and thus the pulling-up node PU of the shift register unit at the second stage is charged.

During Reset phase, i.e., the OUT phase of the shift register unit at the second stage, GL2 becomes a high level, and thus Reset signal of the shift register unit at the first stage also becomes a high level and the second TFT T2 is turned on. At this time, clk3 connected to the first scanning direction selection signal input terminal CLK' of the shift register unit at the first stage becomes a low level, and thus the pulling-up node PU is pulled down so that the pulling-up node PU is reset. The first clock signal input terminal CLK becomes a low level, the second clock signal input terminal CLKB becomes a high level, the fourth TFT T4 and the seventh TFT T7 are turned on and the eighth TFT T8 and the sixth TFT T6 are turned off, the pulling-down control node PD_CN becomes a high level, the fifth TFT T5 is turned on, and the pulling-down node PD also becomes a high level, then the tenth TFT T10 and the ninth TFT T9 are also turned on, the output terminal OUT is pulled down to VSS, and thus a reset is achieved. Other shift register units are similar to the shift register unit described above, and the output of the scanning control signal is achieved progressively.

During the reverse scanning driving, the timing sequence of the shift register driving signals CLK and CLKB are interchanged with each other, the direction selection signals clk3 and clk4 are interchanged with each other, and the timing sequences are as shown in FIG. 6.

During the reverse scanning driving, in the shift register unit at an $n^{th}$ stage:

During INPUT phase, that is, when signal STV_B becomes a high level, the second TFT T2 is turned on. At this time, clk4 connected to the first scanning direction selection signal input terminal CLK' is also at a high level, and thus the pulling-up node PU is charged.

Then, during OUT phase, the second clock signal CLKB becomes a high level, an output signal GLn also becomes a high level; meanwhile GLn also serves as an input signal of the shift register unit at an $(n-1)^{th}$ stage, and then the second TFT 12 of the shift register unit at the $(n-1)^{th}$ stage is also turned on. At this time, clk4 connected to the first scanning direction selection signal input terminal CLK' of the shift register unit at the $(n-1)^{th}$ stage is still at the high level, and thus the pulling-up node PU of the shift register unit at the $(n-1)^{th}$ stage is charged.

During Reset phase, i.e., the OUT phase of the shift register unit at the $(n-1)^{th}$ stage, GL(n-1) becomes a high level, and then Reset signal of the shift register unit at the $n^{th}$ stage (i.e., the first input signal terminal INPUT) also becomes a high level and the first TFT T1 is turned on. At this time, clk4 connected to the first scanning direction selection signal input terminal CLK' becomes a low level, and then the pulling-up node PU is pulled down so that the pulling-up node PU is reset. The Second clock signal input terminal CLKB becomes a low level, the first clock signal input terminal CLK becomes a high level, then the fourth TFT T4 and the seventh TFT T7 are turned on and the eighth TFT T8 and the sixth TFT T6 are turned off, the pulling-down control node PD_CN becomes a high level, the fifth TFT T5 is turned on, and the pulling-down node PD also becomes a high level, and then the tenth TFT T10 and the ninth TFT T9 are also turned on, the output terminal OUT is pulled down to VSS, and thus reset is achieved. Other shift register units are similar to the shift register unit described above, and the output of the scanning control signal is achieved progressively.

If STV_F and STV_B are a same signal, they are generally referred to as STV. During the forward scanning driving, STV is at a high level and clk3 is at a high level, then the first TFT T1 of the shift register unit of the first stage is turned on and the pulling-up node PU is charged. At this time, clk4 is at a low level, although the first TFT T1 of the shift register unit at the last stage is also turned on, the pulling-up node PU is not charged and still at the low level, and the shift register unit will not start. Similarly, during the reverse scanning driving, the shift register unit at the last stage start and the shift register unit at the first stage does not start. Consequently, bi-directional scanning driving can be achieved.

In an embodiment, connection cycle of the shift register units of FIG. 4 is 4, and n is an integer multiple of 4. If not, the driving timing sequence or the connection manner should be adjusted or one or more null shift register units should be added, so that the three requirements for the scanning direction selection signal can be satisfied.

In addition, the shift register unit shown in FIG. 3 can achieve 8-clock driving by using two repeated structures and shifted driving clock signals, which can decrease power consumption of a gate driver effectively. The scanning direction selection signals may be two, three, four or more, and the driving timing sequence and the connection manner should be adjusted accordingly.

Embodiment 2

The shift register unit at each stage as described above can also be structured with a first reset control unit being added on the basis of the structure as shown in FIG. 3 for ensuring that the output terminal is reset by the reset unit as shown in FIG. 3.

Figure 7:
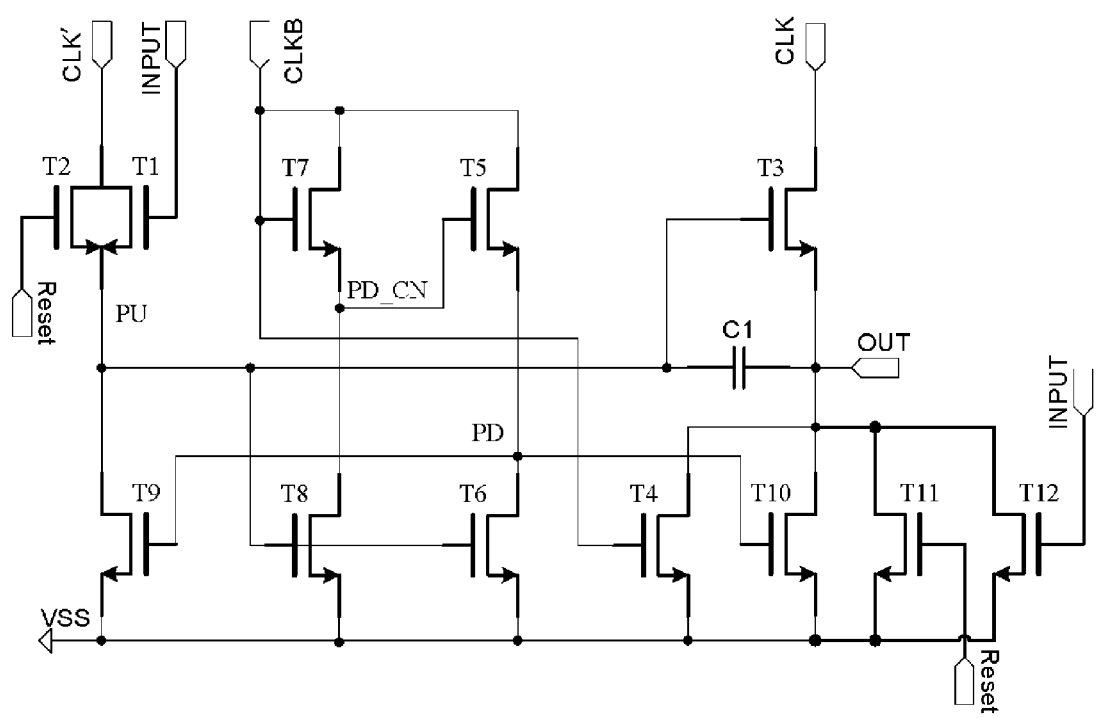
FIG. 7 is a schematic structure diagram of a shift register unit according to a particular embodiment 2 of the present disclosure.

In an embodiment, as shown in FIG. 7, the first reset control unit may include:

an eleventh TFT T11 having a gate connected to the first reset signal input terminal Reset, a source connected to the low level Vss and a drain connected to the output terminal OUT;

a twelfth TFT T12 having a gate connected to the input terminal INPUT, a source connected to the low level VSS and a drain connected to the output terminal OUT.

Figure 8:
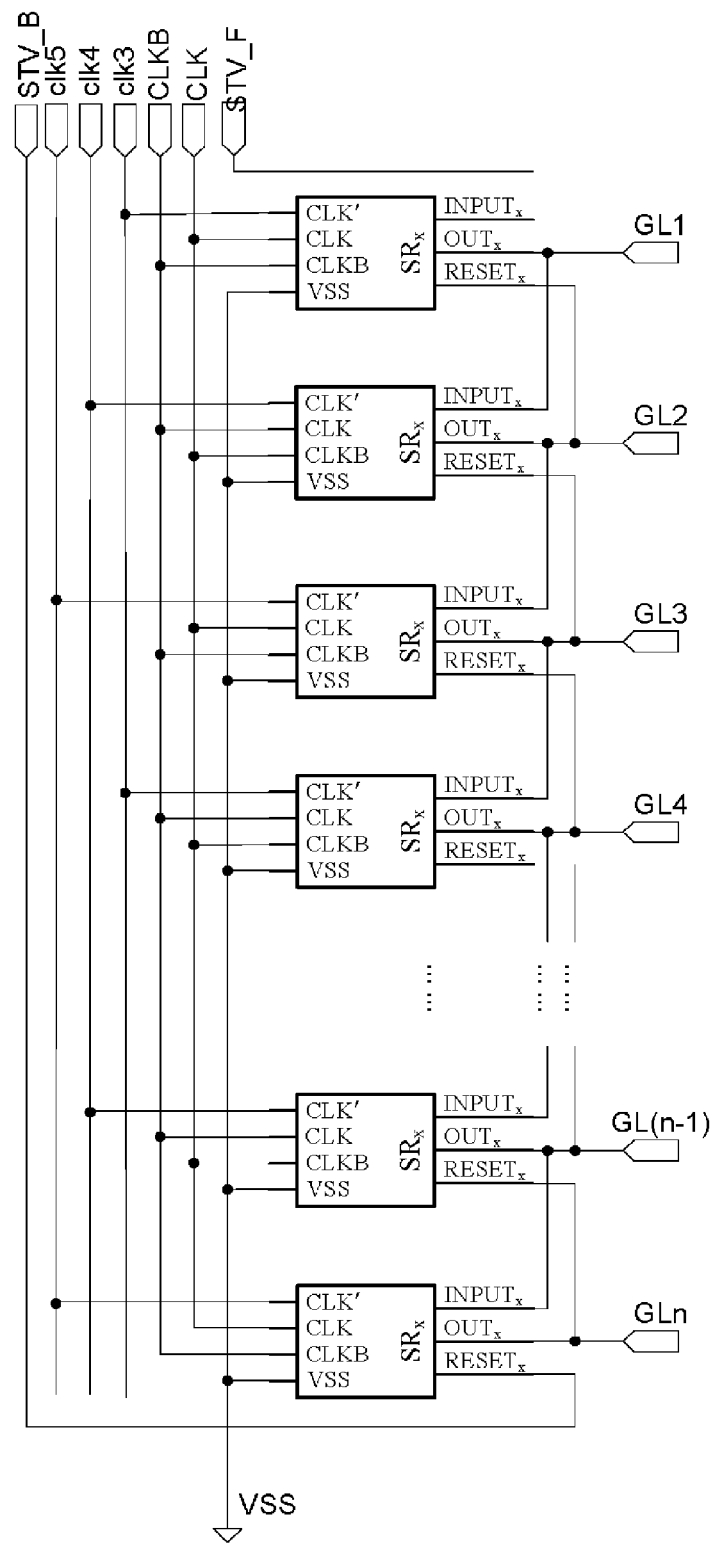
FIG. 8 is a schematic structure diagram of a shift register including the shift register unit shown in FIG. 7 and having 5 driving signals.
Figure 9:
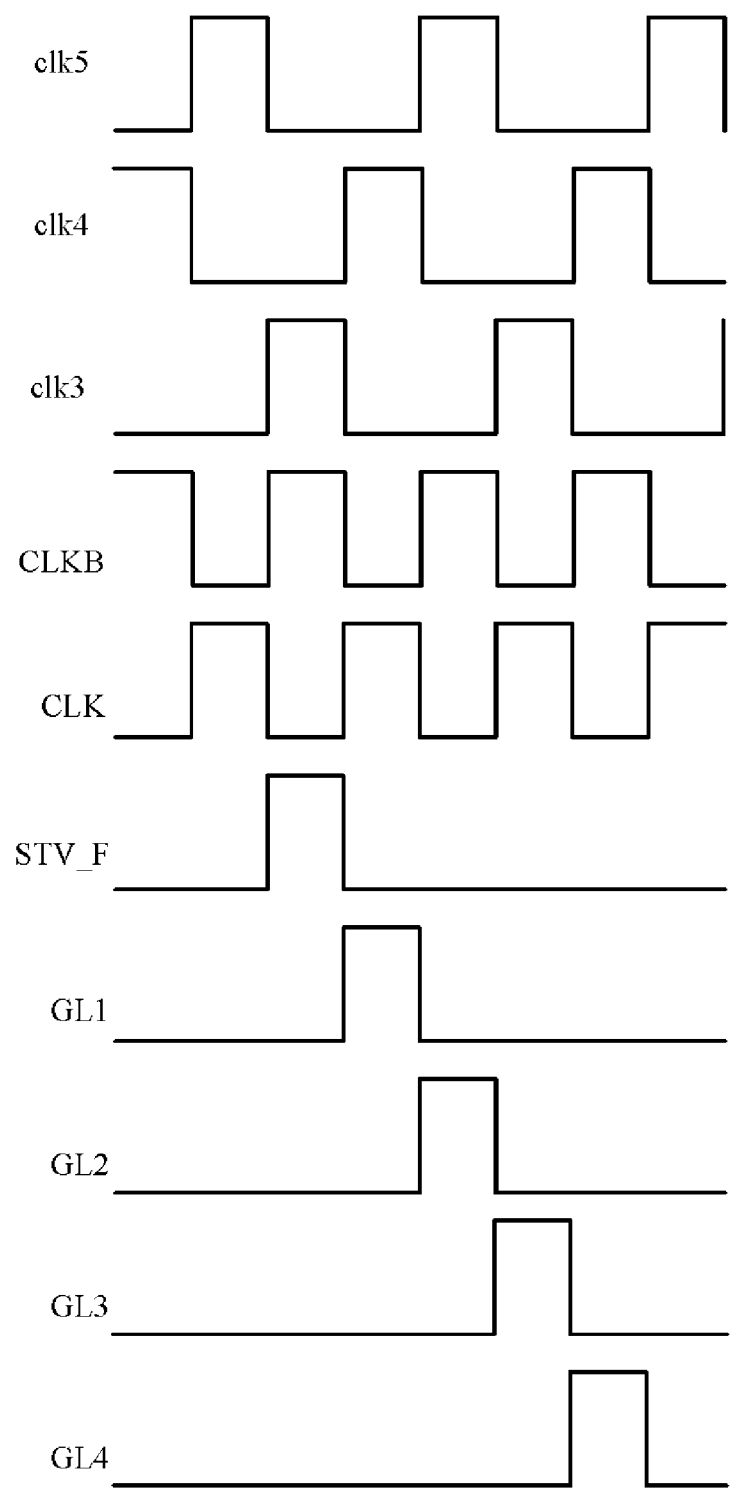
FIG. 9 is a timing sequence diagram for a forward scanning driving of the shift register shown in FIG. 8.
Figure 10:
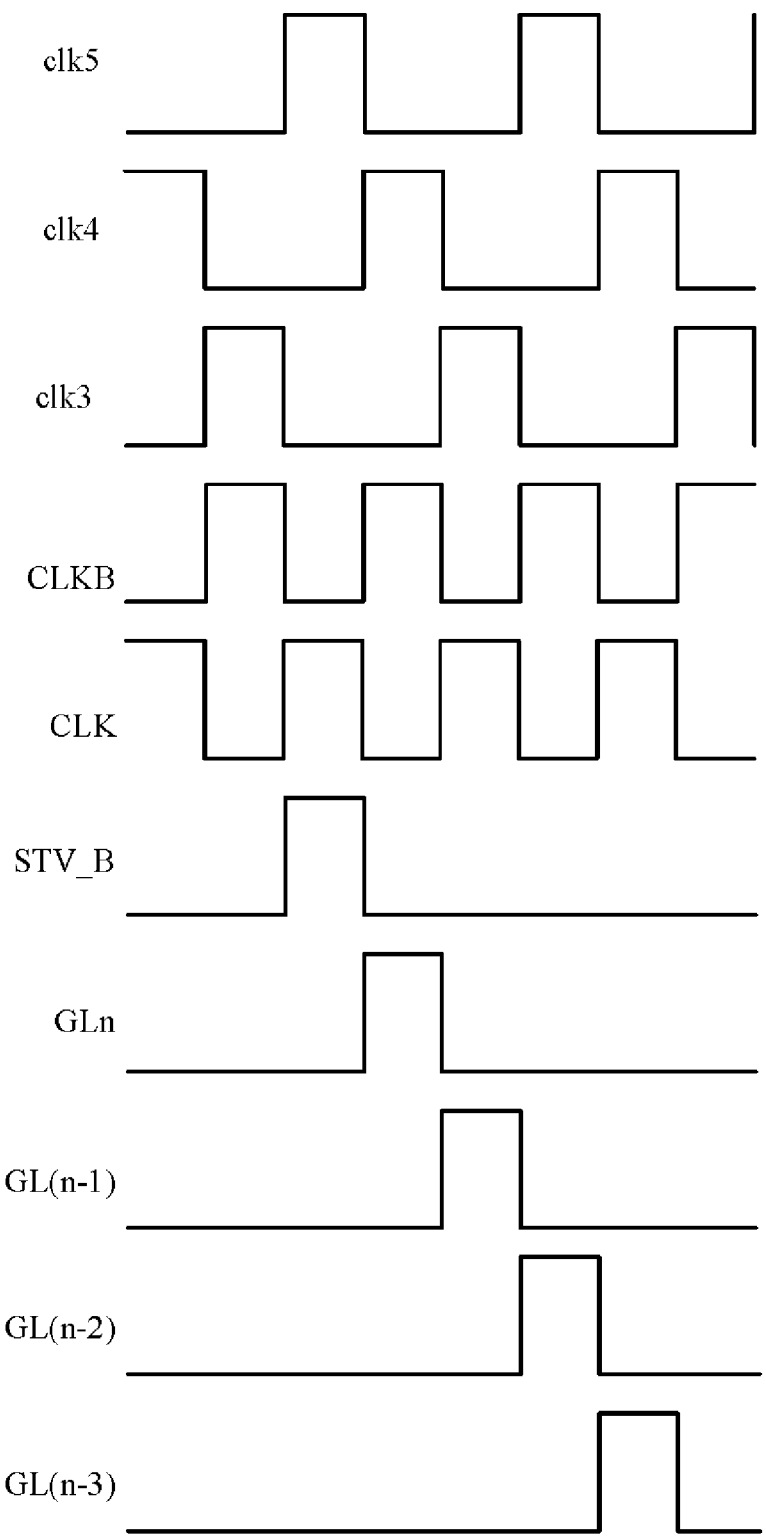
FIG. 10 is a timing sequence diagram for a reverse scanning driving of the shift register shown in FIG. 8.

At this time, a schematic structure of the shift register with five driving signals (5-clock) having the shift register unit shown in FIG. 7 is as shown in FIG. 8, and a timing sequence of its forward scanning driving is as shown in FIG. 9 and a timing sequence of its reverse scanning driving is as shown in FIG. 10.

Figure 11:
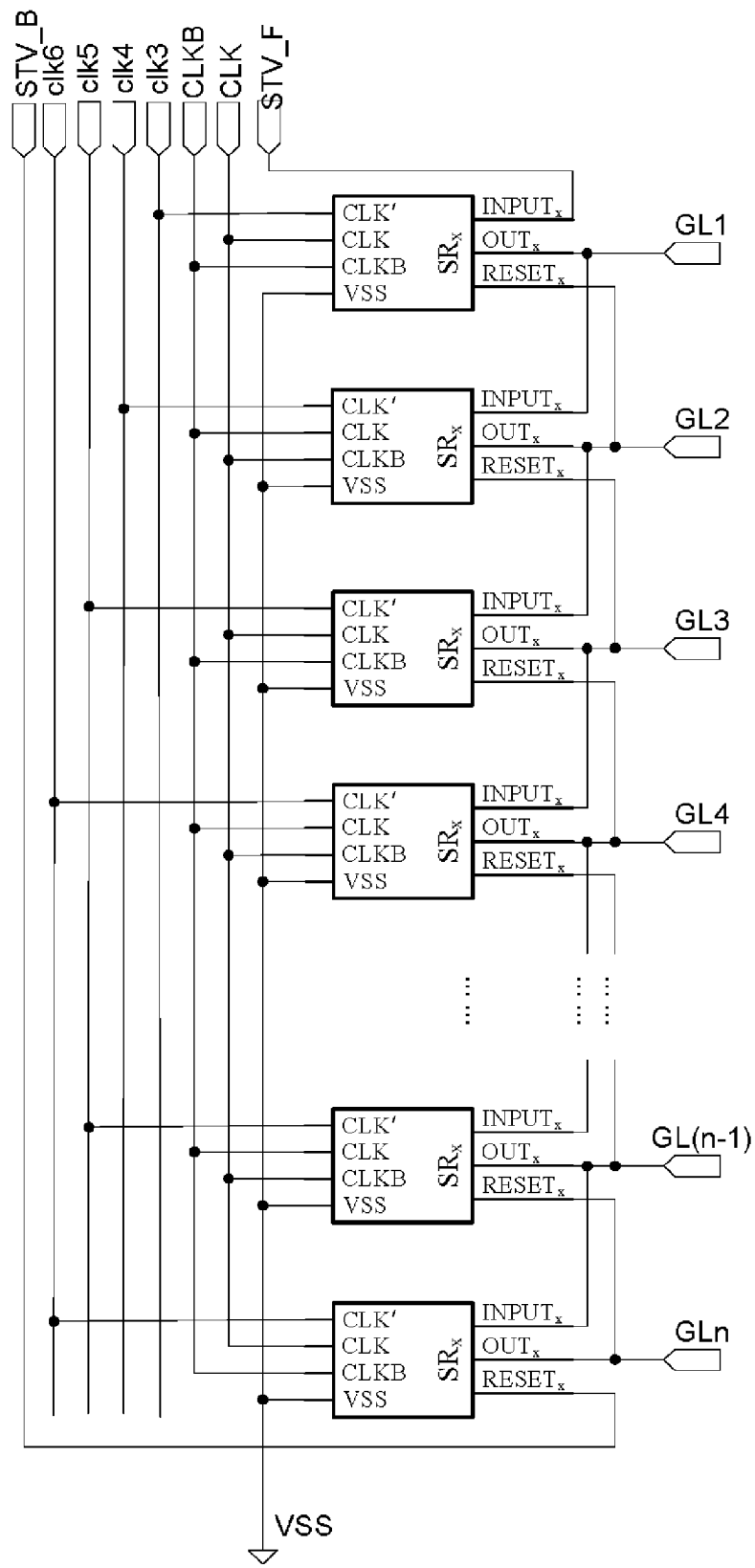
FIG. 11 is a schematic structure diagram of a shift register including the shift register unit shown in FIG. 7 and having 6 driving signals.
Figure 12:
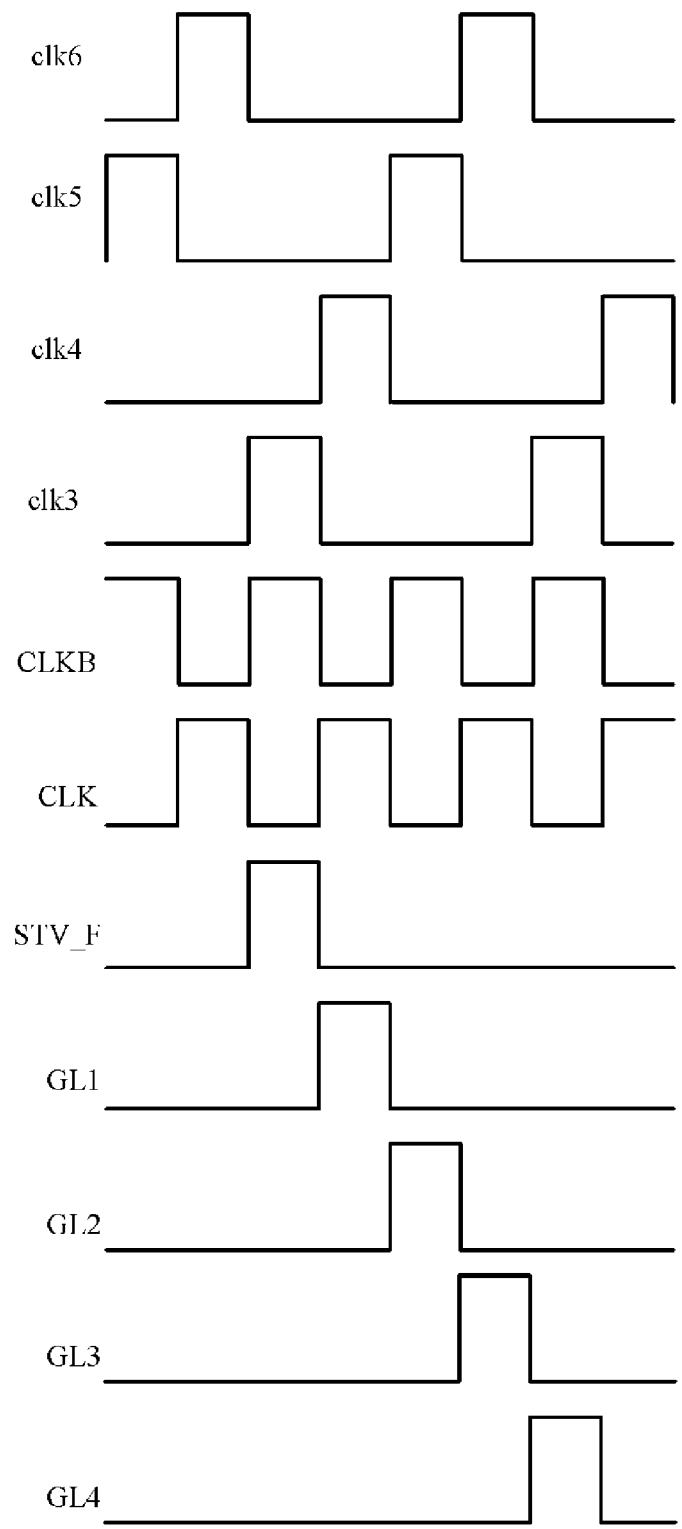
FIG. 12 is a timing sequence diagram for a forward scanning driving of the shift register shown in FIG. 11.
Figure 13:
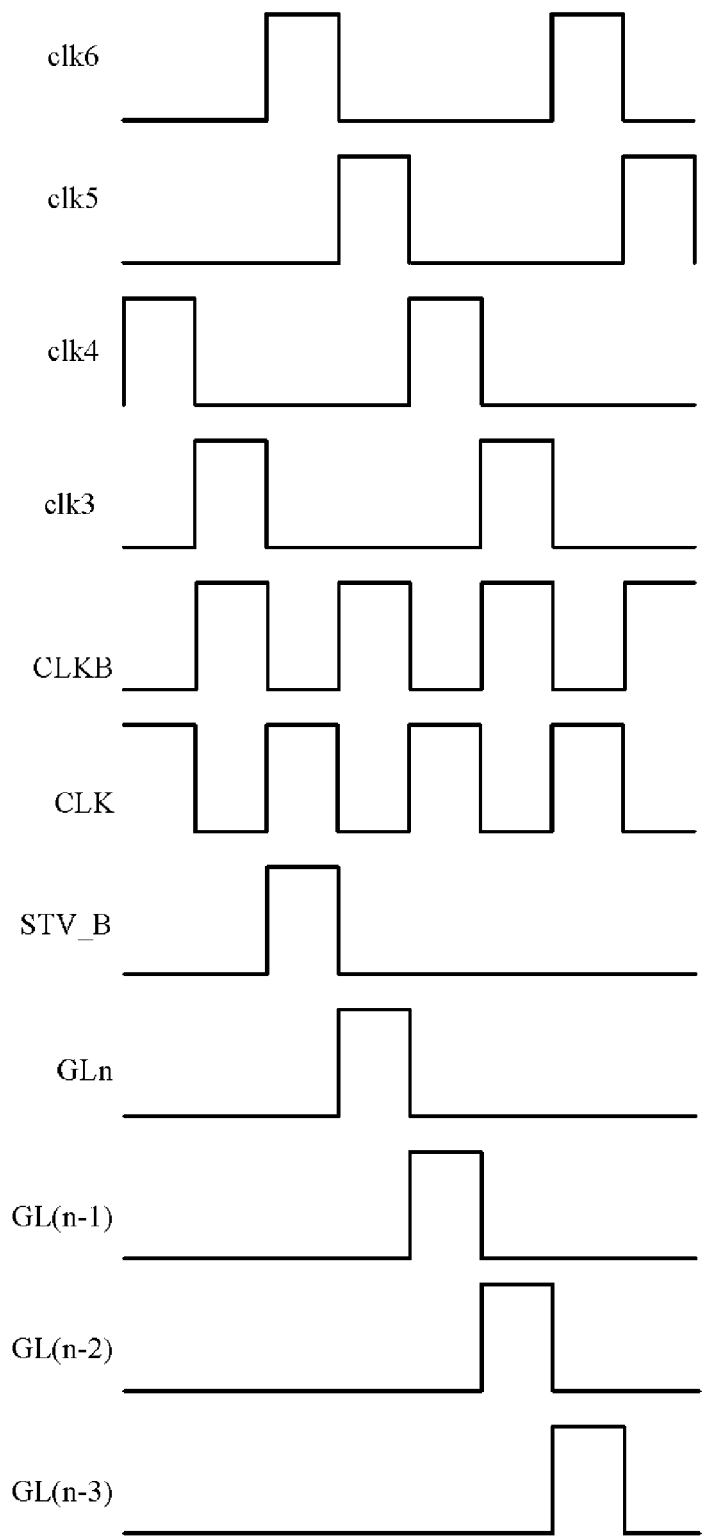
FIG. 13 is a timing sequence diagram for a reverse scanning driving of the shift register shown in FIG. 11.

A schematic structure of the shift register with six driving signals (6-clock) having the shift register unit shown in FIG. 7 is as shown in FIG. 11, and a timing sequence of its forward scanning driving is as shown in FIG. 12 and a timing sequence of its reverse scanning driving is as shown in FIG. 13.

An operation voltage applied to the fourth TFT T4 is always relatively large and its duty ratio is about 50%, which may cause a large drift of threshold voltage and is harmful to the stability of gate driving. The addition of the eleventh TFT T11 and the twelfth TFT T12 can ensure that the output terminal is reset reliably and the reliability of gate driving is increased.

In an embodiment, the output terminal OUT is reset by the eleventh ITT T11 during the forward scanning and by the twelfth TFT T12 during the reverse scanning.

Embodiment 3

In an example, the reset unit may further include:

a fifth TFT T5 having a gate connected to the pulling-down control node PD_CN, a source connected to the pulling-down node PD and a drain connected to the second clock signal input terminal CLKB;

a sixth TFT T6 having a gate connected to the pulling-up node PU, a source connected to the low level VSS and a drain connected to the pulling-down node PD;

a seventh TFT T7 having a gate and a drain connected to the second clock signal input terminal CLKB and a source connected to the pulling-down control node PD_CN;

an eighth TFT T8 having a gate connected to the pulling-up node PU, a source connected to the low level VSS and a drain connected to the pulling-down control node PD_CN;

a ninth TFT T9 having a gate connected to the pulling-down node PD, a source connected to the low level VSS and a drain connected to the pulling-up node PU;

a tenth TFT T10 having a gate connected to the pulling-down node PD, a source connected to the low level VSS and a drain connected to the output terminal OUT; and a thirteenth TFT T13 having a gate connected to a second reset control unit, a source connected to the low level VSS and a drain connected to the output terminal OUT;

wherein the second reset control unit is used to ensure that the output terminal OUT is reset by the reset unit.

Figure 14:
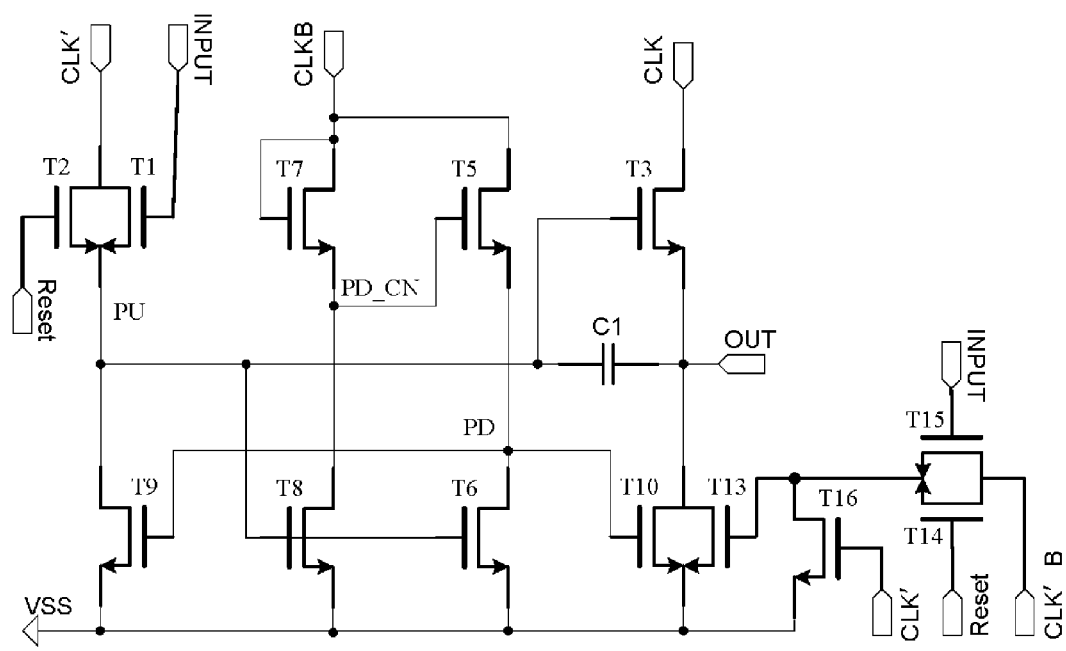
FIG. 14 is a schematic structure diagram of a shift register unit according to a particular embodiment 3 of the present disclosure.

In an embodiment, as shown in FIG. 14, the second reset control unit described above includes:

a fourteenth TFT T14 having a gate connected to the first reset signal input terminal Reset, a source connected to the gate of the thirteenth TFT T13 and a drain connected to the second scanning direction selection signal input terminal CLK'B;

a fifteenth TFT T15 having a gate connected to the input terminal INPUT, a source connected to the gate of the thirteenth TFT T13 and a drain connected to the second scanning direction selection signal input terminal CLK'B;

a sixteenth TFT 16 having a gate connected to the first scanning direction selection signal input terminal CLK', a source connected to the low level VSS and a drain connected to the gate of the thirteenth TFT T13.

Figure 15:
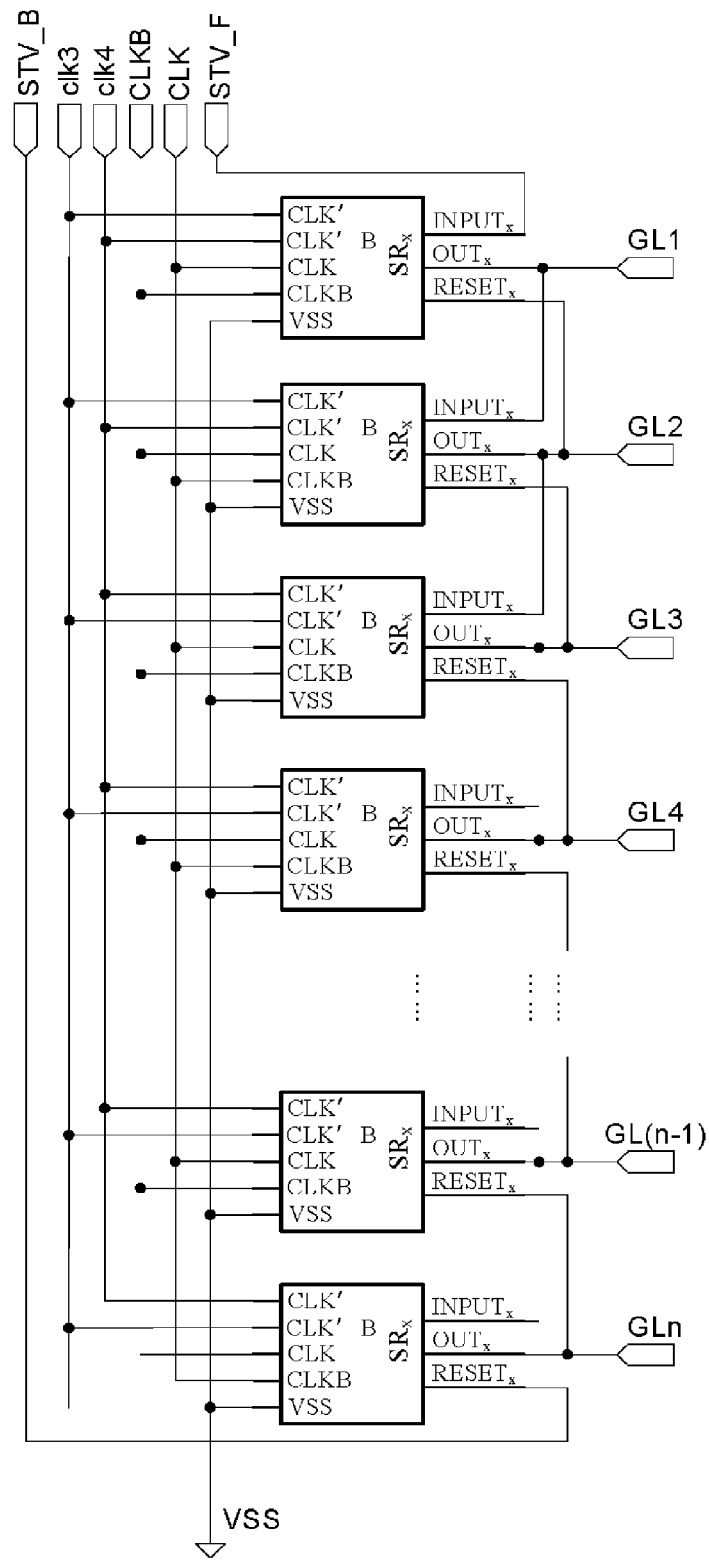
FIG. 15 is a schematic structure diagram of a shift register including the shift register unit shown in FIG. 14 and having 4 driving signals.

At this time, a schematic structure of the shift register with four driving signals (4-clock) having the shift register unit shown in FIG. 14 is as shown in FIG. 15, and a timing sequence of its forward scanning driving is as the same as that shown in FIG. 5 and a timing sequence of its reverse scanning driving is as the same as that shown in FIG. 6.

Below, an operation process for the second reset control unit ensuring that the output terminal OUT is reset will be explained.

When the forward scanning is performed:

during INPUT phase, the first scanning direction selection signal input terminal CLK' and the input terminal INPUT are at a high level, the second scanning direction selection signal input terminal CLK'B and the first reset signal input terminal Reset are at a low level, the fourteenth TFT T14 is turned off, the fifteenth TFT 115 and the sixteenth TFT T16 are turned on, the gate of the thirteenth TFT T13 is pulled down and thus the thirteenth TFT T13 is turned off;

during OUT phase, the input terminal INPUT and the first reset signal input terminal Reset are at a low level (no matter whether the first scanning direction selection signal input terminal CLK' and the second scanning direction selection signal input terminal CLK'B are at a high level or a low level), the fourteenth TFT T14 and the fifteenth TFT T15 are turned off (no matter whether the sixteenth TFT T16 is turned on or off), the gate of the thirteenth TFT T13 is kept to be a low level, that is, the thirteenth TFT T13 is kept to be off;

during Reset phase, the second scanning direction selection signal input terminal CLK'B and the first reset signal input terminal Reset are at a high level, the first scanning direction selection signal input terminal CLK' and the input terminal INPUT are at a low level, the fourteenth TFT T14 is turned on, the fifteenth TFT T15 and the sixteenth TFT T16 are turned off, the gate of the thirteenth TFT T13 becomes a high level, that is, the thirteenth TFT T13 is turned on to reset the output terminal OUT;

during non-operation phase, the input terminal INPUT, the first reset signal input terminal Reset are always kept to be at a low level, that is, the fourteenth TFT T14 and the fifteenth TFT T15 are turned off; when the first scanning direction selection signal input terminal CLK' becomes a high level, the sixteenth TFT T16 is turned on, the gate of the thirteenth TFT T13 is pulled down, that is, the thirteenth TFT T13 is kept to be off, so that the bias voltage applied on the thirteenth TFT T13 is decreased, which is advantageous for prolonging the lifespan of the thirteenth TFT T13, that is, the reliability of the reset of the shift register.

The reverse scanning is similar to the forward scanning, and the difference mainly lies in that it is necessary to make some changes in driving signals.

Embodiment 4

Figure 16:
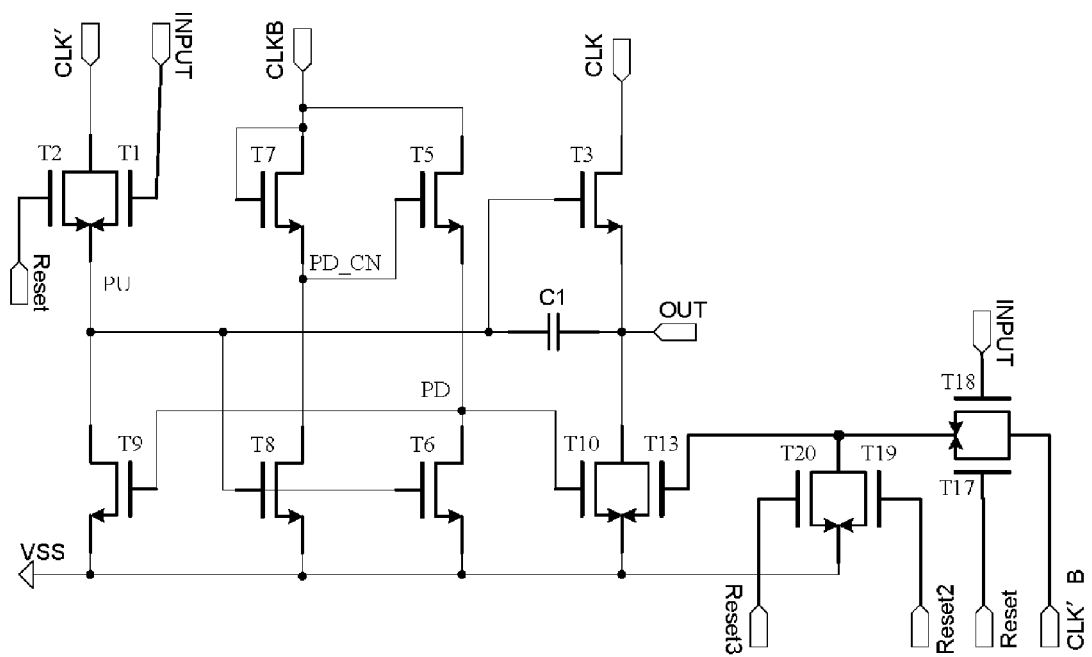
FIG. 16 is a schematic structure diagram of a shift register unit according to a particular embodiment 4 of the present disclosure.

As shown in FIG. 16, the second reset control unit described above may include:

a seventeenth TFT T17 having a gate connected to the first reset signal input terminal Reset, a source connected to the gate of the thirteenth TFT T13 and a drain connected to the second scanning direction selection signal input terminal CLK'B;

an eighteenth TFT T18 having a gate connected to the input terminal INPUT, a source connected to the gate of the thirteenth TFT T13 and a drain connected to the second scanning direction selection signal input terminal CLK'B;

a nineteenth TFT T19 having a gate connected to a second reset signal input terminal Reset2, a source connected to the low level VSS and a drain connected to the gate of the thirteenth TFT T13; and a twentieth TFT T20 having a gate connected to a third reset signal input terminal Reset3, a source connected to the low level VSS and a drain connected to the gate of the thirteenth TFT T13.

Figure 17:
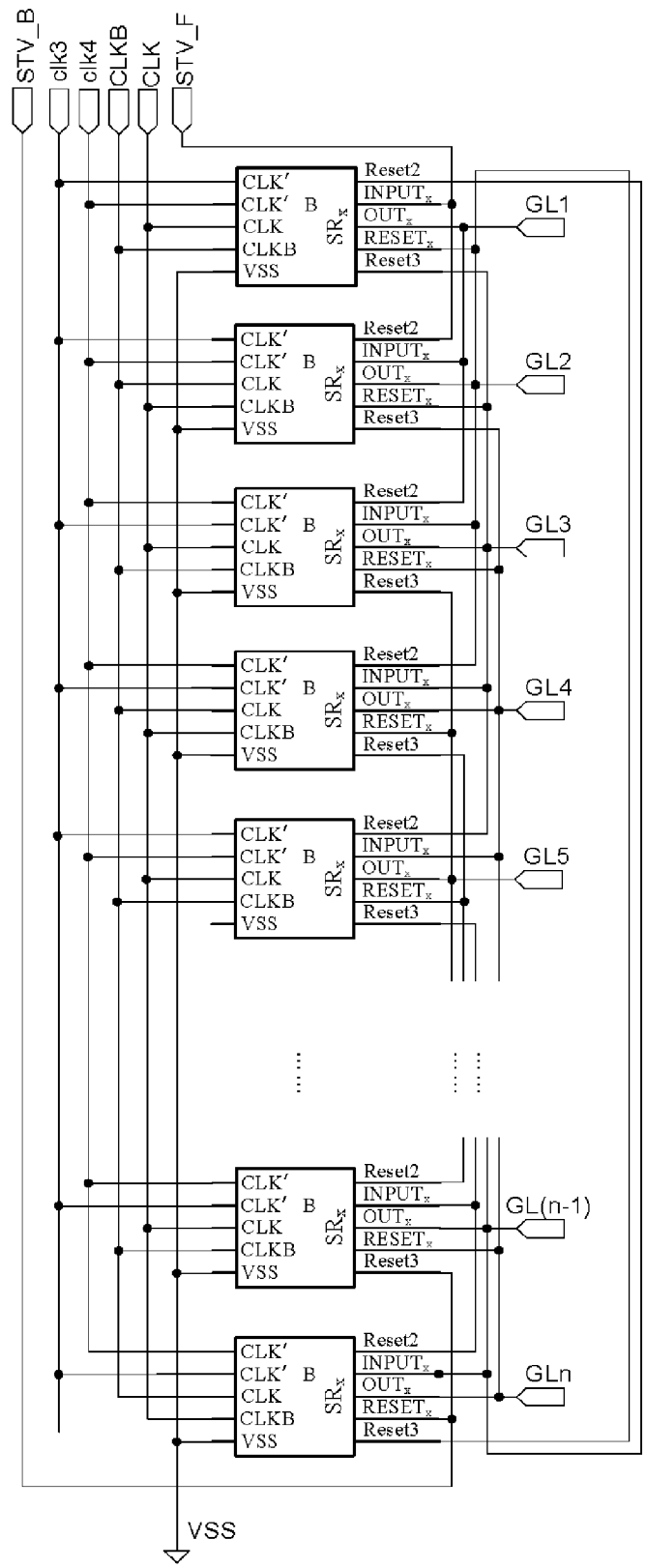
FIG. 17 is a schematic structure diagram of a shift register including the shift register unit shown in FIG. 16 and having 4 driving signals.

At this time, a schematic structure of the shift register with four driving signals (4-clock) having the shift register unit shown in FIG. 16 is as shown in FIG. 17, and a timing sequence of its forward scanning driving is the same as that shown in FIG. 5 and a timing sequence of its reverse scanning driving is the same as that shown in FIG. 6.

Compared to the shift register unit shown in FIG. 3, the shift register unit shown in FIG. 16 has the advantageous of better reliability; compared to the shift register unit shown in FIG. 7, it has the advantageous of reducing the number of the TFTs for directly resetting the output terminal OUT and thus decreasing the area occupied by the shift register unit effectively (since the TFTs for directly resetting the output terminal OUT have a relatively larger size).

Below, an operation process for the second reset control unit ensuring that the output terminal OUT is reset will be explained.

When the forward scanning is performed:

during pre-input phase, the input terminal INPUT, the first reset signal input terminal Reset and the third reset signal input terminal Reset3 are at a low level, and the second reset signal input terminal Reset2 is at a high level, then the seventeenth TFT T17, the eighteenth TFT T18 and the twentieth TFT T20 are turned off, the nineteenth TFT T19 is turned on, the gate of the thirteenth TFT T13 is pulled down, and thus the thirteenth TFT T13 is turned off;

during INPUT phase, the input terminal INPUT is at a high level, the second scanning direction selection signal input terminal CLK'B, the first reset signal input terminal Reset, the second reset signal input terminal Reset2 and the third reset signal input terminal Reset3 are at a low level, the seventeenth TFT T17, the nineteenth TFT T19 and the twentieth TFT T20 are turned off, the gate of the thirteenth TFT T13 still is kept to be a low level and thus the thirteenth TFT T13 is turned off although the eighteenth TFT T18 is turned on;

during OUT phase, the input terminal INPUT, the first reset signal input terminal Reset, the second reset signal input terminal Reset2 and the third reset signal input terminal Reset3 are at a low level (no matter whether the second scanning direction selection signal input terminal CLK'B is at a high level or a low level), the seventeenth TFT T17, the eighteenth TFT T18, the nineteenth TFT T19 and the twentieth TFT T20 are turned off, the gate of the thirteenth TFT T13 is kept to be a low level, that is, the thirteenth TFT T13 is kept to be off;

during Reset phase, the second scanning direction selection signal input terminal CLK'B and the first reset signal input terminal Reset are at a high level, the input terminal INPUT, the second reset signal input terminal Reset2 and the third reset signal input terminal Reset3 are at a low level, the seventeenth TFT T17 is turned on, the eighteenth TFT T18, the nineteenth TFT T19 and the twentieth TFT T20 are turned off, the gate of the thirteenth TFT T13 becomes a high level, that is, the thirteenth TFT T13 is turned on to reset the output terminal OUT;

during the reset phase of the thirteenth TFT T13, the input terminal INPUT, the first reset signal input terminal Reset, the second reset input terminal Reset2 and the third reset input terminal Reset3 become a high level, and the seventeenth TFT T17, the eighteenth TFT T18 and the nineteenth TFT T19 are turned off, and the twentieth TFT T20 is turned on, the gate of the thirteenth TFT T13 is pulled down and the thirteenth TFT T13 is turned off, so that the reset for the thirteenth TFT T13 is completed.

during non-operation phase, the input terminal INPUT, the first reset signal input terminal Reset, the second reset signal input terminal Reset2 and third reset signal input terminal Reset3 are kept to be at a low level continuously, that is, the seventeenth TFT T17, the eighteenth TFT T18, the nineteenth TFT T19 and the twentieth TFT T20 are kept to be off; the voltage at the gate of the thirteenth TFT T13 is kept at a low level, so that the bias voltage applied on the thirteenth TFT T13 is decreased, which is advantageous for prolonging the lifespan of the thirteenth TFT T13, that is, the reliability of the reset of the shift register.

The reverse scanning driving is similar to the forward scanning driving, and the difference mainly lies in that it is necessary to make some changes in driving signals.

At last, a comprehensive description will be given to the above several embodiments:

The shift register adopting the shift register unit shown in FIG. 3 or FIG. 7 (or having the same or similar interface) can adopt the structure shown in FIG. 8 or FIG. 11 or the structure derived therefrom, in addition to the structure shown in FIG. 4.

As compared to FIG. 4, a direction selection signal clk5 is added in FIG. 8, and the connection relationship is shown in FIG. 8. A driving timing sequence for such a structure is shown in FIG. 9 and FIG. 10. The particular driving process is similar to that for the structure in FIG. 3. When the reverse scanning driving is performed, the timing sequences of the shift register driving signals CLK and CLKB are interchanged, and the direction selection signals clk3 and clk5 are interchanged, and the particular timing sequence is shown in FIG. 9 and FIG. 10. An advantage is that the number of the units connected to each selection signal clkx is decreased (becomes n/3 from n/2), so that the power consumption caused by the storage capacitor can be reduced; another advantage is that the duty ratio of the scanning direction selection signal can be reduced (becomes 33% from 50%) when the shift register unit is not in operation, so that the possibility of being turned on accidentally can be reduced effectively and thus the reliability is increased.

As compared to FIG. 4, two scanning direction selection signals clk5 and clk6 are added in FIG. 11, and the connection relationship is shown in FIG. 11. A driving timing sequence for such a structure is shown in FIG. 12 and FIG. 13. The particular driving process is similar to that for the structure in FIG. 3. When the reverse scanning driving is performed, the timing sequences of the shift register driving signals CLK and CLKB are interchanged, the direction selection signal clk3 and clk6 are interchanged and the direction selection signals clk4 and clk5 are interchanged, and the particular timing sequence is shown in FIG. 12 and FIG. 13. An advantage is that the number of the units connected to each scanning direction selection signal clkx is decreased (becomes n/4 from n/2), so that the power consumption caused by the storage capacitor can be reduced; another advantage is that the duty ratio of the direction selection signal can be reduced (becomes 25% from 50%) when the shift register unit is not in operation, so that the possibility of being turned on accidentally can be reduced effectively and thus the reliability is increased.

The shift register adopting the shift register unit shown in FIG. 14 (or having the same or similar interface) can adopt the structure shown in FIG. 8 or FIG. 11 or the structure derived therefrom, in addition to the structure shown in FIG. 15.

The shift register adopting the shift register unit shown in FIG. 16 (or having the same or similar interface) can adopt the structure shown in FIG. 8 or FIG. 11 or the structure derived therefrom, in addition to the structure shown in FIG. 17, and has the advantage of better stability.

In addition, according to an embodiment of the present disclosure, there is provided a display including any one of the above described shift registers according to the embodiments of the present disclosure.

The above descriptions are only for illustrating the embodiments of the present disclosure, and in no way limit the scope of the present disclosure. It will be obvious that those skilled in the art may make modifications, variations and equivalences to the above embodiments without departing from the spirit and scope of the present disclosure as defined by the following claims. Such variations and modifications are intended to be included within the spirit and scope of the present disclosure.

What is claimed is:

1. A shift register including a plurality of shift register units at a plurality of stages, wherein the shift register unit at each stage includes:
    a first Thin Film Transistor (TFT) for charging or discharging a pulling-up node under the control of a driving input signal and a scanning direction selection signal, wherein the first TFT serves as a start switch of the shift register unit at the stage to charge the pulling-up node during a forward scanning driving and serves as a reset switch of the shift register unit at the stage to discharge the pulling-up node during a reverse scanning driving;
    a second TFT for charging or discharging the pulling-up node under the control of a first reset signal and the scanning direction selection signal, wherein the second TFT serves as a reset switch of the shift register unit at the stage to discharge the pulling-up node during a forward scanning driving and serves as a start switch of the shift register unit at the stage to charge the pulling-up node during a reverse scanning driving;
    a reset unit for resetting the pulling-up node and an output terminal;
    a pulling-up unit for pulling up a potential at the output terminal during an outputting phase; and
    a reset control unit configured to ensure that the output terminal is reset by the reset unit;
    wherein, a gate of the first TFT is connected to an input terminal, a source of the first TFT is connected to the pulling-up node, a drain of the first TFT is connected to a first scanning direction selection signal input terminal; and
    a gate of the second TFT is connected to a first reset signal input terminal, a source of the second TFT is connected to the pulling-up node, and a drain of the second TFT is connected to the first scanning direction selection signal input terminal;
    wherein the reset control unit includes:
    a first reset control TFT having a gate connected to the first reset signal input terminal, a source connected to a low level and a drain connected to the output terminal; and
    a second reset control TFT having a gate connected to the input terminal, a source connected to the low level and a drain connected to the output terminal.

2. The shift register according to claim 1, wherein the pulling-up unit includes:
    a third TFT having a gate connected to a first terminal of a storage capacitor, a source connected to the output terminal and a drain connected to a first dock signal input terminal; and
    the storage capacitor having the first terminal connected to the pulling-up node and a second terminal connected to the output terminal.

3. The shift register according to claim 1, wherein the reset unit includes:
    a fourth TFT having a gate connected to a second clock signal input terminal, a source connected to the low level and a drain connected to the output terminal;
    a fifth TFT having a gate connected to a pulling-down control node, a source connected to a pulling-down node and a drain connected to the second dock signal input terminal;
    a sixth TFT having a gate connected to the pulling-up node, a source connected to the low level and a drain connected to the pulling-down node;
    a seventh TFT having a gate and a drain connected to the second dock signal input terminal and a source connected to the pulling-down control node;

an eighth TFT having a gate connected to the pulling-up node, a source connected to the low level and a drain connected to the puffing-down control node;

a ninth TFT having a gate connected to the puffing-down node, a source connected to the low level and a drain connected to the pulling-up node; and a tenth TFT having a gate connected to the pulling-down node, a source connected to the low level and a drain connected to the output terminal.

4. A display including the shift register according to claim 1.

5. A shift register including a plurality of shift register units at a plurality of stages, wherein the shift register unit at each stage includes:

a first Thin Film Transistor (TFT) for charging or discharging a pulling-up node under the control of a driving input signal and a scanning direction selection signal, wherein the first TFT serves as a start switch of the shift register unit at the stage to charge the pulling-up node during a forward scanning driving and serves as a reset switch of the shift register unit at the stage to discharge the pulling-up node during a reverse scanning driving;

a second TFT for charging or discharging the pulling-up node under the control of a first reset signal and the scanning direction selection signal, wherein the second TFT serves as a reset switch of the shift register unit at the stage to discharge the pulling-up node during a forward scanning driving and serves as a start switch of the shift register unit at the stage to charge the pulling-up node during a reverse scanning driving;

a reset unit for resetting the pulling-up node and an output terminal;

a pulling-up unit for pulling up a potential at the output terminal during an outputting phase; and a reset control unit configured to ensure that the output terminal is reset by the reset unit;

wherein, a gate of the first TFT is connected to an input terminal, a source of the first TFT is connected to the pulling-up node, a drain of the first TFT is connected to a first scanning direction selection signal input terminal; and a gate of the second TFT is connected to a first reset signal input terminal, a source of the second TFT is connected to the pulling-up node, and a drain of the second TFT is connected to the first scanning direction selection signal input terminal;

wherein the reset control unit includes:

a first reset control TFT having a gate connected to the first reset signal input terminal, a source connected to the reset unit and a drain connected to a second scanning direction selection signal input terminal;

a second reset control TFT having a gate connected to the input terminal, a source connected to the source of the first reset control TFT and a drain connected to the second scanning direction selection signal input terminal.

6. The shift register according to claim 5, wherein the reset unit includes:

a fifth TFT having a gate connected to a pulling-down control node, a source connected to a puffing-down node and a drain connected to a second clock signal input terminal;

a sixth TFT having a gate connected to the pulling-up node, a source connected to a low level and a drain connected to the pulling-down node;

a seventh TFT having a gate and a drain connected to the second clock signal input terminal and a source connected to the pulling-down control node;

an eighth TFT having a gate connected to the pulling-up node, a source connected to the low level and a drain connected to the pulling-down control node;

a ninth TFT having a gate connected to the pulling-down node, a source connected to the low level and a drain connected to the pulling-up node;

a tenth TFT having a gate connected to the pulling-down node, a source connected to the low level and a drain connected to the output terminal; and a thirteenth TFT having a gate connected to the source of the first reset control TFT, a source connected to the low level and a drain connected to the output terminal.

7. The shift register according to claim 5, wherein the reset control unit further includes:

a third reset control TFT having a gate connected to the first scanning direction selection signal input terminal, a source connected to the low level and a drain connected to the source of the first reset control TFT.

8. The shift register according to claim 5, wherein the reset control unit further includes:

a fourth reset control TFT having a gate connected to a second reset signal input terminal, a source connected to the low level and a drain connected to the source of the first reset control TFT; and a fifth reset control TFT having a gate connected to a third reset signal input terminal, a source connected to the low level and a drain connected to the source of the fourth reset control TFT.

* * * * *